(12) United States Patent
Herschbein et al.

(10) Patent No.: US 6,843,893 B2
(45) Date of Patent: Jan. 18, 2005

(54) METAL DRY ETCH USING ELECTRONIC FIELD

(75) Inventors: Steven B. Herschbein, Hopewell Junction, NY (US); Herschel M. Marchman, Poughquag, NY (US); Chad Rue, Poughkeepsie, NY (US); Michael R. Sievers, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/317,679

(22) Filed: Dec. 12, 2002

(65) Prior Publication Data

US 2004/0112857 A1 Jun. 17, 2004

(51) Int. Cl.[7] .......................... C10B 1/00; H01L 21/302
(52) U.S. Cl. ........................ 204/224 M; 156/345.11; 156/345.39; 156/345.4
(58) Field of Search ........................ 204/224 M, 248; 156/345.11, 345.39, 345.4; 216/62, 66, 75, 76, 79, 80, 87, 90, 94, 97, 101; 438/704, 705, 712, 754

(56) References Cited

U.S. PATENT DOCUMENTS

| 5,431,774 | A | 7/1995 | Douglas |
|---|---|---|---|
| 5,736,002 | A | 4/1998 | Allen et al. |
| 6,261,955 | B1 | 7/2001 | Aliyu et al. |
| 6,281,589 | B1 | 8/2001 | Nguyen et al. |
| 6,352,081 | B1 | 3/2002 | Lu et al. |
| 6,368,954 | B1 | 4/2002 | Lopatin et al. |
| 6,402,806 | B1 | 6/2002 | Schmitt et al. |

OTHER PUBLICATIONS

"Selective Area Oxidation of Silicon With Scanning Force Microscope", Day et. al.; Applied Physics Letters (1993); 62 (21) pp. 2691–2693.*

"Nanometer Lithography On Silicon and Hydrogenated Amorphous Silicon With Low–Energy Electrons"; Kramer et al.; Microelectronic Engineering (1995); 27 (1–4); pp. 47–50.*

* cited by examiner

Primary Examiner—George A. Goudreau
(74) Attorney, Agent, or Firm—McGinn & Gibb, PLLC; Steven Capella, Esq.

(57) ABSTRACT

A method and structure for an apparatus for removing metal from an integrated circuit structure is disclosed. A container holds an integrated circuit structure that has a metal portion. An electronic device connected to the container produces an electronic field proximate to a limited region of the metal portion. A first supply connected to the container supplies an oxidizing agent within the container. A solvent supply connected to the container supplies solvent to the limited region of the metal portion.

13 Claims, 3 Drawing Sheets

METAL DRY ETCH USING ELECTRONIC FIELD

BACKGROUND OF THE INVENTION

1. Field of the Invention

The present invention generally relates to removing metal from integrated circuit (IC) structures and more particularly to an improved method that utilizes an electronic field to oxidize a limited region of metal, after which the oxidized portion of the metal is removed using a solvent.

2. Description of the Related Art

The clean milling of metal features in IC products has been, and still is, a very active field of research. More specifically, the clean removal of metal features is an active topic in research for improving today's chip repair processes. The ability to do such editing/repair is especially important in the IC chip fabrication process to permit salvage/rework of metal features. Present methods for editing metal features have limited utility because of non-volatility and subsequent re-deposition of metal after local editing is performed, usually by focused ion beam (FIB) techniques. Thus, there is a need for improved apparatus and methods that allow the clean milling of metal features anywhere in the structure of the IC (e.g., surface or deephole).

SUMMARY OF THE INVENTION

The invention provides apparatus and methods for removing metal from an integrated circuit structure. The invention allows the clean milling of metal features anywhere in the structure of the IC.

In one aspect, the invention encompasses an apparatus for removing metal from an integrated circuit structure, the apparatus comprising:

an electronic device adapted to apply an electronic field to a limited region of the metal; and a solvent supply operatively connected to the electronic device, the solvent supply being adapted to supply solvent to the limited region of the metal.

In another aspect, the invention encompasses an apparatus for removing metal from an integrated circuit structure, the apparatus comprising:

(i) a container adapted to hold an integrated circuit structure that has a metal portion, (ii) an electronic device connected to the container, the electronic device being adapted to produce an electronic field proximate to a limited region of the metal portion, (iii) a first supply connected to the container, the first supply being adapted to supply an oxidizing agent within the container, (iv) a solvent supply connected to the container, the solvent supply being adapted to supply solvent to the limited region of the metal portion.

The electronic device is preferably a probe. The solvent supply is preferably a hollow portion within the probe. The electronic device is more preferably an ion beam generator or a microscope tip. The solvent preferably has chemical properties that facilitate removal of metal oxides. The electronic field in combination with the oxidizing agent causes the limited region of the metal to become metal oxide.

In another aspect, the invention encompasses a method of removing metal from an integrated circuit structure, the method comprising:

(i) oxidizing a limited region of the metal by applying an electronic field to the limited region, and (ii) removing the limited region by applying a solvent to the limited region.

The oxidizing is preferably performed in an atmosphere containing an oxidizing agent. The oxidizing produces a metal oxide preferably only in the limited region of the metal. The solvent preferably has chemical properties that facilitate removal of the metal oxides.

The invention can also create an opening in the integrated circuit structure to expose the metal. The applying of the electronic field directs an ion beam to the limited region of the metal. The applying of the electronic field places an electronic field generated by a probe adjacent to the limited region of the metal.

These and other aspects of the invention are described in further detail below.

BRIEF DESCRIPTION OF THE DRAWINGS

The invention will be better understood from the following detailed description of preferred embodiments of the invention with reference to the drawings.

DETAILED DESCRIPTION OF THE INVENTION

This invention involves implementing a very localized electric field to initiate the oxidation of a metal feature. This oxidized area is subsequently removed by introducing a chemical that selectively volatilizes/mobilizes the metal oxide product. More specifically, the invention preferably involves electron or photon beam induced oxidation and subsequent etching through scanned probe techniques. The invention preferably uses both focused beam (ion or photon) and scanned probe microscopy techniques working alone or in tandem.

For near top surfaces in IC parts, a conducting atomic force microscope (AFM) probe tip is biased to promote oxidation in the presence of oxygen/water in an extremely localized area. The critical line dimensions of modern IC devices are rapidly approaching the limits of state-of-the-art FIB tools, and the tremendous increase in resolution offered by AFM technology is used by the invention to provide a vast potential for IC editing.

To remove the metal oxide created with the AFM, a chemical that has been shown to volatilize/mobilize the metal oxide, is introduced across the metal feature. If the product of this reaction is volatile, the metal oxide is removed without a further step. If the chemical product from this reaction with the metal oxide is not volatile, the addition of a solvent that would make the product soluble would be used. With AFM, the whole working area (sample and tip) can work in a non-air environment and so for the latter process, the metal feature could be etched by immersing the part in a solution of the reactant to mobilize the metal oxide and a solvent that can make the product soluble. For non surface metal removal (e.g., deep hole repairs), a hollow AFM tip is used to initiate the oxidation process and also deliver the reactant chemicals to the metal feature.

Figure 1:
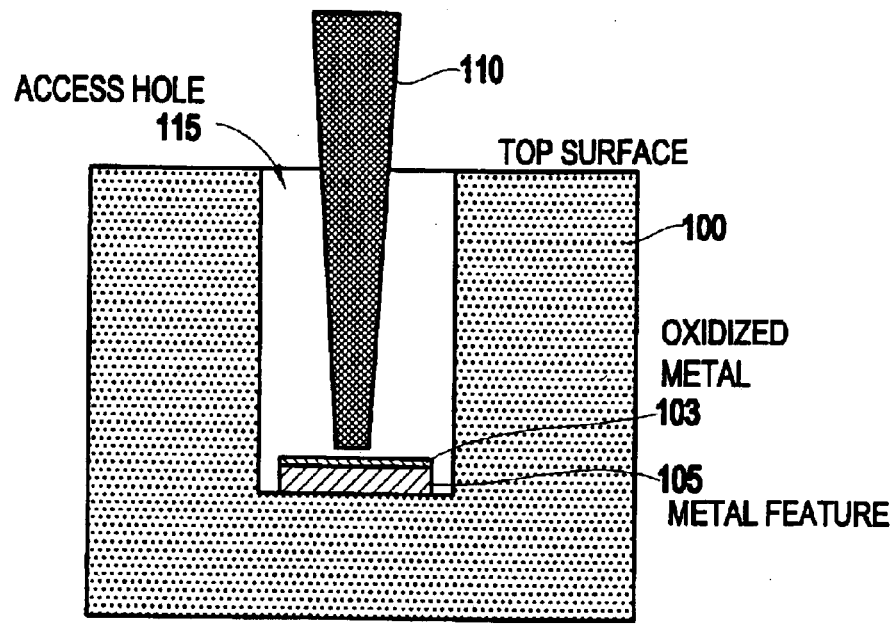
FIG. 1 is a schematic diagram of a cross-sectional view of a metal feature being oxidized.
Figure 2:
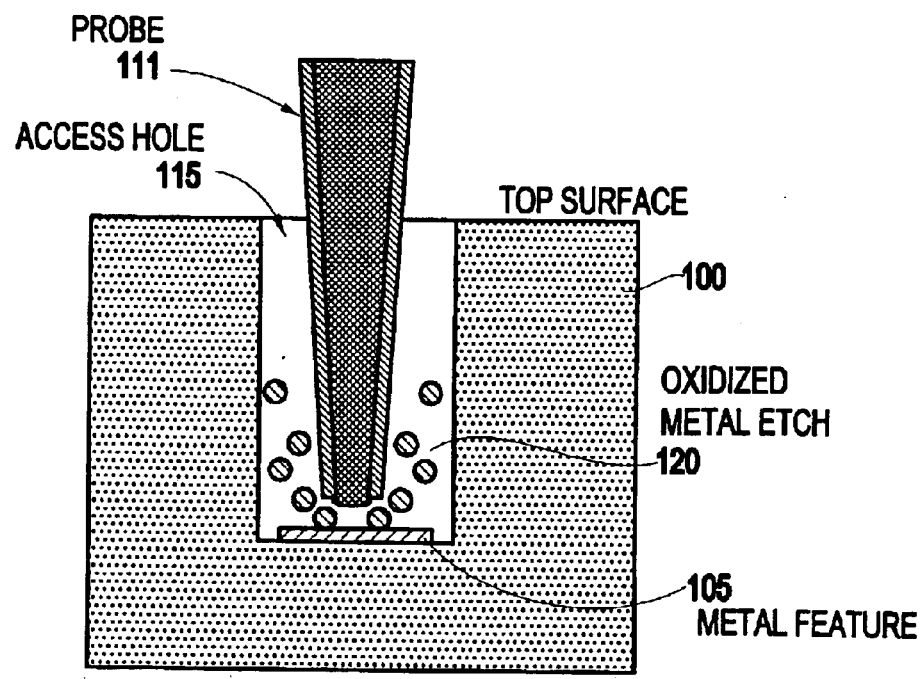
FIG. 2 is a schematic diagram of a cross-sectional view of a metal feature being oxidized.
Figure 3:
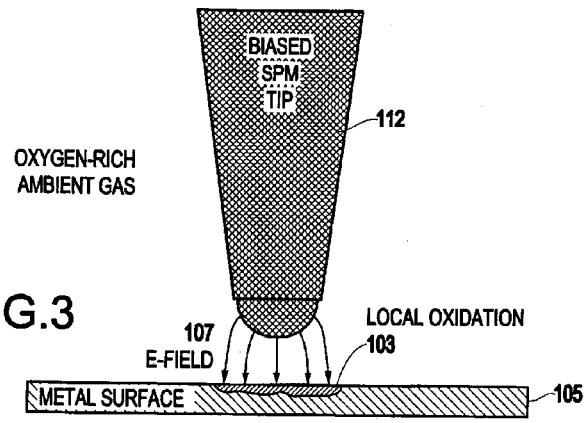
FIG. 3 is a schematic diagram of a cross-sectional view of a metal feature being oxidized.

FIGS. 1 and 2 illustrate removal of metal that is below some form of insulator, while FIG. 3 illustrates the removal of a top level metal. As shown in FIGS. 1 and 2, for the case of IC chip repair, interlevel dielectric (ILD) material 100 layers that may exist between the top surface of the metal feature 105 are first removed typically using FIB gas assisted etching (GAE) processing to create an access hole 115. Probe based methods could also be used to form the access hole 115. Once the metal feature 105 has been reached, it is oxidized 103 locally (within the access opening 115) through beam 110 exposure (see FIG. 1). FIGS. 2 and 3 illustrates a similar oxidization process (electron field 107) for a surface metal 105 using a probe 112 (e.g., scanning probe microscope SPM tip). An additional feature of the invention that is illustrated in FIG. 2 is that the probe 111 is hollow. Therefore, the probe 111 in FIG. 2 can generate the electronic field (such as field 107 in FIG. 3) and also very precisely supply the solvent to remove the oxidized metal through the hollow portion of the probe 111. For example, exposure of a copper feature to 532 nm photons (focused laser) initiates thermal oxidation processes in the presence of a gas such as oxygen. Electron (negative ions) beams are used to stimulate oxidation in the presence of halogen gases.

Upon oxidation, chemistries to volatilize or mobilize the metal-oxide product are introduced. In one example, the invention uses a hollow microscope (SPM) tip 111, where the solvent is introduced directly to the oxidized-metal 120 for etching in that local oxidized metal area (FIG. 2). In FIG. 3, the entire structure can be rinsed to remove only the oxidized metal. In such a situation, the rinsing solvent would be selected to only affect the oxidized metal and to not affect the remaining surrounding metal regions.

This multi-step procedure (oxidization of the metal and then solvent rinsing of the metal oxide) is particularly advantageous when a direct one-step etching process for the metal feature is not possible chemically, or might require more localization through masking by the induced oxide layer. By etching the metal oxide 103 product instead of the metal 105 directly, the invention minimizes over-etching (where metal removal is not desired). This method is also a highly compatible compliment to existing beam based repair techniques (i.e. ion, electron, or photon).

Figure 4:
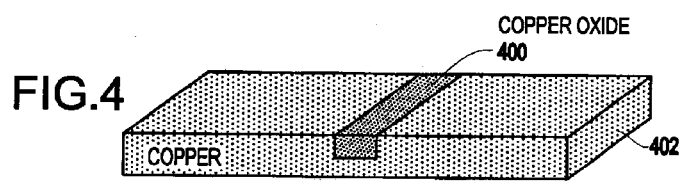
FIG. 4 is a schematic diagram of a perspective view of a metal feature being oxidized.
Figure 5:
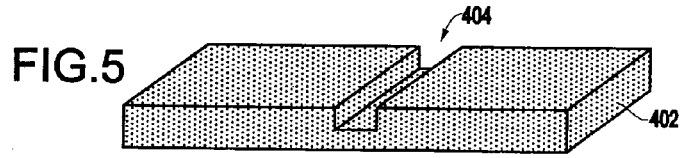
FIG. 5 is a schematic diagram of a perspective view of an oxidized metal feature being removed.
Figure 6:
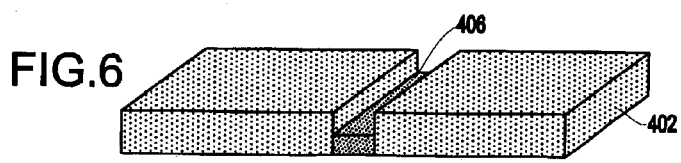
FIG. 6 is a schematic diagram of a perspective view of a metal feature being oxidized.
Figure 7:
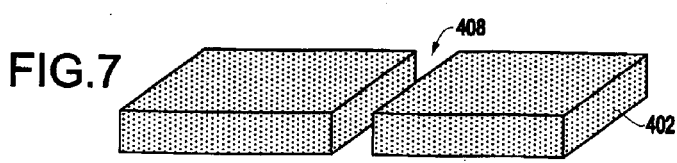
FIG. 7 is a schematic diagram of a perspective view of an oxidized metal feature being removed.

FIGS. 4–7 illustrates one example where a channel 408 is etched through a metal layer 402 (e.g., copper). As shown in FIG. 4, the electron field or ion beam is used to oxidize a limited portion 400 of the metal (copper oxide). Then, the metal oxide 400 is removed using a solvent that attacks the metal oxide 400 yet does not affect the metal 402. As shown in FIG. 5, this rinsing process leaves a channel 404. This process is repeated in FIGS. 6 and 7 to deepen the channel and create the final channel 408. In FIG. 6, item 406 represents additional oxidized metal.

Figure 8:
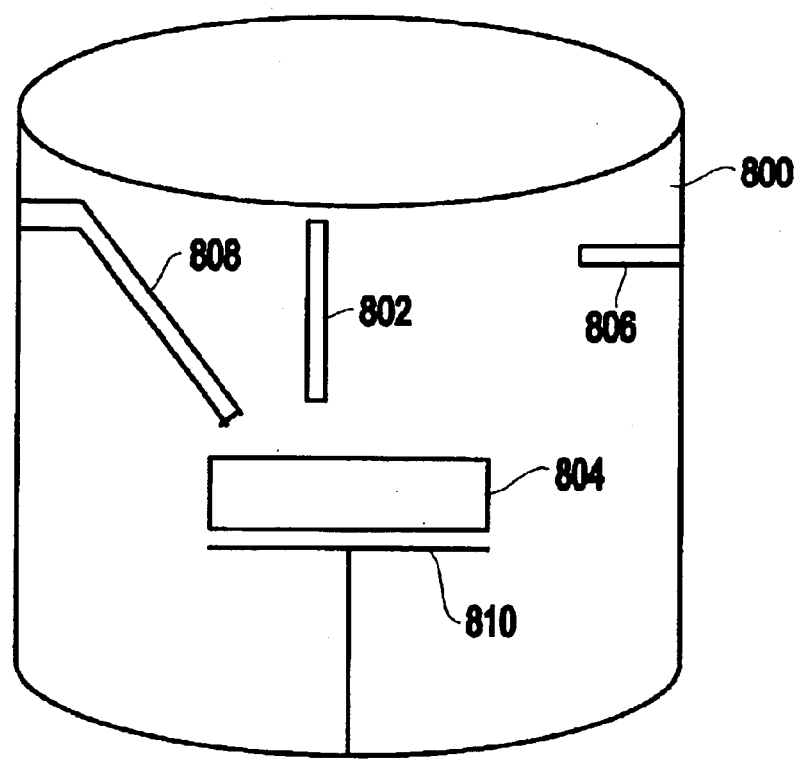
FIG. 8 is a schematic diagram of a system according to the invention.

FIG. 8 illustrates an exemplary container 800 that includes a support 810 that holds an integrated circuit structure 804 that has metal regions that need to be removed. A supply/vacuum port 806 allows various ambient chemicals (oxygen, halogen, etc.) to be introduced into the container 800, and allows a vacuum to be created within the container 800. Item 802 represents a device that can produce an ion beam (e.g., ion beam generator) and alternatively represents the different probes 111, 112 that are discussed above. The device 802 is classified as a non-contact device because it does not actually make contact with the integrated circuit structure 804. Instead, as more clearly illustrated in FIGS. 1 and 3, the device 802 comes close enough to generate the electronic field and oxidize the metal, yet does not actually make contact with the metal 105. If there was contact between the device 802 and the metal 105, it would not be possible to control the limited region of oxidation because the conductive nature of the metal 105 would accept all charge and current from the device 802 and make any oxidation cause thereby more widespread. Item 808 represents a supply to for applying a solvent or other necessary rinsing agent to the integrated circuit structure 804.

Figure 9:
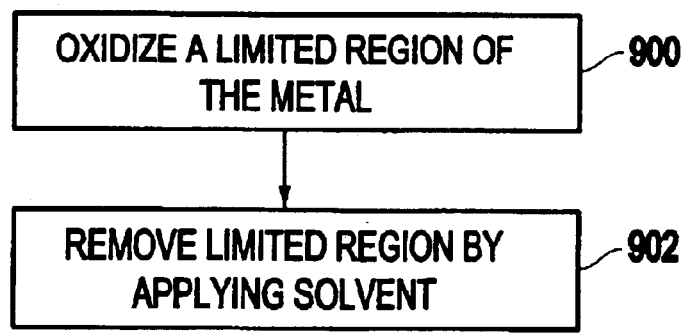
FIG. 9 is a flowchart showing some of the processing steps of the invention.

FIG. 9 illustrates a flow diagram of the invention. In item 901, the invention oxidizes a limited region of the metal by applying an electronic field to the limited region. Next, in item 902, the invention removes the oxidized limited region by applying a solvent to the limited region.

Therefore, as shown above, the invention involves implementing a very localized electric field to initiate the oxidation of a metal feature. This oxidized area is subsequently removed by introducing a chemical that selectively volatilizes/mobilizes the metal oxide product. The invention uses both focused beam (ion or photon) and scanned probe microscopy techniques working alone or in tandem.

While the invention has been described in terms of preferred embodiments, those skilled in the art will recognize that the invention can be practiced with modification within the spirit and scope of the appended claims.

What is claimed is:

1. An apparatus for removing metal from an integrated circuit structure, said apparatus comprising:
   an electronic device adapted to apply an electronic field to a limited region of said metal portion; and
   a solvent supply comprising a hollow portion within said electronic device, said solvent supply being adapted to supply solvent to said limited region of said metal portion.

2. An apparatus for removing metal from an integrated circuit structure, said apparatus comprising:
   an electronic device adapted to apply an electronic field to a limited region of said metal portion; and
   a solvent supply operatively connected to said electronic device, said solvent supply being adapted to supply solvent to said limited region of said metal portion,
   wherein said electronic device comprises a probe and said solvent supply comprises a hollow portion within said probe.

3. The apparatus in claim 1, wherein said electronic device comprises an ion beam generator.

4. The apparatus in claim 1, wherein said electronic device comprises a microscope tip.

5. The apparatus in claim 1, wherein said electronic device comprises a non-contact device.

6. The apparatus in claim 1, wherein said solvent has chemical properties that attack metal oxides.

7. The apparatus in claim 1, wherein said electronic field causes said limited region of said metal to become metal oxide.

8. An apparatus for removing metal from an integrated circuit structure, said apparatus comprising:
   a container adapted to hold said integrated circuit structure having a metal portion;

an electronic device connected to said container, said electronic device being adapted to produce an electronic field proximate to a limited region of said metal portion;

a first supply connected to said container, said first supply being adapted to supply an oxidizing agent within said container, and a solvent supply comprising a hollow portion within said electronic device connected to said container, said solvent supply being adapted to supply solvent to said limited region of said metal portion.

9. An apparatus for removing metal from an integrated circuit structure, said apparatus comprising:

a container adapted to hold said integrated circuit structure having a metal portion;

an electronic device connected to said container, said electronic device being adapted to produce an electronic field proximate to a limited region of said metal portion;

a first supply connected to said container, said first supply being adapted to supply an oxidizing agent within said container; and a solvent supply connected to said container, said solvent supply being adapted to supply solvent to said limited region of said metal portion, wherein said electronic device comprises a probe and said solvent supply comprises a hollow portion within said probe.

10. The apparatus in claim 8, wherein said electronic device comprises an ion beam generator.

11. The apparatus in claim 8, wherein said electronic device comprises a microscope tip.

12. The apparatus in claim 8, wherein said solvent has chemical properties that attack metal oxides.

13. The apparatus in claim 8, wherein said electronic field in combination with said oxidizing agent cause said limited region of said metal to become metal oxide.

* * * * *